United States Patent [19]

Ohta

[11] Patent Number: 4,849,826
[45] Date of Patent: Jul. 18, 1989

[54] DIGITAL NON-LINEAR PRE-EMPHASIS/DE-EMPHASIS APPARATUS FOR ELIMINATING NOISE COMPONENTS FROM VIDEO SIGNALS IN A VIDEO SIGNAL PROCESSING SYSTEM

[75] Inventor: Haruo Ohta, Yawata, Japan

[73] Assignee: Matsushita Electric Industrial Co., Ltd., Osaka, Japan

[21] Appl. No.: 119,069

[22] Filed: Nov. 10, 1987

[30] Foreign Application Priority Data

Nov. 14, 1986 [JP] Japan ................................ 61-272498
May 29, 1987 [JP] Japan ................................ 62-135131

[51] Int. Cl.$^4$ ............................................. H04N 5/76
[52] U.S. Cl. ...................................... 358/336; 358/167; 358/166; 333/14; 455/72; 307/490; 360/65
[58] Field of Search ............... 358/167, 310, 315, 327, 358/335, 37–40, 340, 166, 160, 336; 333/14; 307/490; 360/65; 455/72; 328/142, 167, 168

[56] References Cited

U.S. PATENT DOCUMENTS 4,658,305  4/1987  Tsushima ........................ 358/327 X
4,668,988  5/1987  Sasaki et al. .................... 358/315 X
4,730,165  3/1988  Nishino et al. ................... 455/72 X

OTHER PUBLICATIONS

"Digital Signal Processing in Video Tape Recorders", by S. Mehrgardt, IEEE Trans. on Consumer Electronics, vol. CE-31, No. 3, pp. 374–377, issued on Aug. 1985.

Primary Examiner—Robert L. Richardson
Attorney, Agent, or Firm—Wenderoth, Lind & Ponack

[57] ABSTRACT

A digital non-linear pre-emphasis/de-emphasis apparatus is arranged such that a frequency band of a high-pass filter for extracting a high frequency component signal of an input signal is varied according to the input signal by feeding back the output signal of the high-pass filter through a first non-linear input/output circuit. The first non-linear input/output circuit multiplies the output signal of the high-pass filter by a coefficient which is a function of the output signal of the high-pass filter to obtain a feedback signal. The output signal of the high-pass filter is also applied to a second non-linear input/output circuit which multiplies the output signal of the high-pass filter by a coefficient which is a function of the output signal of the high-pass filter. An output signal of the second non-linear input/output circuit is mixed with the input signal by an operation circuit to obtain an output signal which is non-linearly emphasized or de-emphasized.

11 Claims, 7 Drawing Sheets

DIGITAL NON-LINEAR PRE-EMPHASIS/DE-EMPHASIS APPARATUS FOR ELIMINATING NOISE COMPONENTS FROM VIDEO SIGNALS IN A VIDEO SIGNAL PROCESSING SYSTEM

BACKGROUND OF THE INVENTION

1. Field of the Invention

The present invention relates to a digital-signal non-linear pre-emphasis/de-emphasis apparatus used for eliminating noise components from video signals in a video signal processing system such as a video tape recorder.

2. Description of the Prior Art

Recently, a variety or prior art systems have been proposed for digitally processing video signals while either recording or reproducing video signals in conventional consumerstandard video tape recorders designed for recording analog video signals on a magnetic tape.

More particularly, in a recording mode, an input analog video signal is converted to a digital signal to be subjected to various digital signal processes required for recording, and reconverted to an analog signal before eventually being recorded on a magnetic tape. Conversely, in a reproduction mode, an analog video signal reproduced from a magnetic tape is converted to a digital signal to be subjected to various digital signal processes required for reproduction, and reconverted to an analog video signal before eventually being outputted to the TV monitor. Actually, by digitally processing video signals instead of the conventional analog video signal processing and by introducing large-scale digital ICs, a drastic reduction of the components required for a video tape recorder, and significant improvement of performance and stability of a video tape recorder can be realized. For example, refer to a technical report entitled; "Digital Signal Processing in Video Tape Recorders" written by S. Mehrgart, IEEE Trans. on Consumer Electronics, Vol. CE-31, No. 3, pages 374 through 377, published on August, 1985.

In order to effectively reduce noise from video signals during recording or reproduction normally, conventional consumer-use video tape recorders incorporate non-linear pre-emphasis and de-emphasis circuits.

More specifically, in the recording mode, the non-linear preemphasis circuit emphasizes the high-frequency components of a video signal in such a way that the amount of emphasis becomes larger as the signal amplitude becomes smaller, thereby allowing the needed emphasis without expanding the dynamic range of the video signal. In the reproduction mode, the non-linear de-emphasis circuit de-emphasizes in a way opposite to that of the emphasis process. These processes significantly suppress noise components having small amplitudes and also effectively suppress waveform distortion of signal components having large amplitudes. Since the pre-emphasis and de-emphasis characteristics are opposite to each other, basically, the signal components remain free from degradation.

The non-linear pre-emphasis circuit mentioned above has already been realized by effectively utilizing the non-linear characteristic of diodes. Likewise, a non-linear de-emphasis circuit having characteristics opposite that of the non-linear pre-emphasis circuit has also been realized by inserting a non-linear pre-emphasis circuit into the negative feedback path of an operational amplifier.

However, when digitally processing video signals during the recording and reproduction modes, there arises a problem regarding how to realize a digital non-linear pre- emphasis circuit and a digital non-linear de-emphasis circuit which have opposite characteristics.

SUMMARY OF THE INVENTION

The primary object of the present invention is to provide a novel digital non-linear pre-emphasis apparatus which executes a non-linear pre-emphasis process by implementing digital signal processing.

Another object of the invention is to provide a novel digital non-linear pre-emphasis apparatus which is capable of independently setting a specific frequency band to be emphasized and the amount of emphasis in order that these can vary themselves in accordance with the signal amplitude.

Still another object of the invention is to provide a novel digital non-linear de-emphasis apparatus which accurately executes a non-linear de-emphasis process in a manner opposite to the non-linear pre-emphasis process by implementing digital signal processing.

A further object of the invention is to provide a novel digital non-linear pre-emphasis/de-emphasis apparatus which is capable of selectively executing both the non-linear pre-emphasis process and the non-linear de-emphasis process having opposite characteristics by implementing digital signal processing.

To securely achieve those objects mentioned above, a digital non-linear pre-emphasis/de-emphasis apparatus according to the present invention executes a process satisfying the following condition:

$$y_n = b_n \cdot u_n + x_n$$

$$u_n = x_n - x_{n-k} + a_{n-k} \cdot u_{n-k}$$

where $x_n$ denotes an input signal at a time n, $y_n$ an output signal, $u_n$ a parameter; $a_n$ and $b_n$ are each a function of $u_n$; and k denotes a positive integer.

An apparatus executing such process comprises: a high-pass filter means for obtain a high frequency component signal $u_n$ of an input signal $x_n$; a first non-linear processing means for multiplying the signal $u_n$ by a coefficient $a_n$ which is a function of $u_n$ to obtain a feedback signal $a_n \cdot u_n$ which is fed back to the high-pass filter means to vary a frequency band of the high-pass filter means; a second nonlinear processing means for multiplying the signal $u_n$ by a coefficient $b_n$ which is a function of $u_n$ to obtain a signal $b_n \cdot u_n$; and an operation means for mixing the input signal $x_n$ and the output signal $b_n \cdot u_n$ of the second non-linear processing means to obtain an output signal $y_n = b_n \cdot u_n + x_n$. The output signal $u_n$ of the high-pass filter means is $u_n + x_n - x_{n-k} + a_{n-k} \cdot u_{n-k} =$ (input signal)−(delayed input signal)-+delayed feedback signal).

By properly selecting the function of each of the first and second non-linear processing means, the apparatus having this configuration can operate either as a non-linear pre-emphasis apparatus or as a non-linear de-emphasis apparatus.

When the coefficients of the first and second non-linear processing means are respectively set to a(u) and b(u) with respect to an signal u input thereto to obtain a non-linear pre-emphasis apparatus, a non-linear de-emphasis apparatus having a non-linear de-emphasis characteristic opposite to a non-linear pre-emphasis characteristic of the non-linear pre-emphasis apparatus can be realized by setting coefficients A(U) and B(U) of the respective first and second non-linear processing means with respect to an input signal U input thereto so as to satisfy the following conditions:

$$U(A) = \frac{a(u) + b(u)}{1 + b(u)}$$

$$U(B) = \frac{b(u)}{1 + b(u)}$$

$$U = (1 + b(u)) \cdot u$$

Those object mentioned above and further scope of applicability of the present invention will become more apparent from the detailed description given hereinbelow.

BRIEF DESCRIPTION OF THE DRAWINGS

The present invention will be better understood from the detailed description given hereinbelow in reference to the appended drawings which are given by way of illustration only, wherein.

DESCRIPTION OF THE PREFERRED EMBODIMENTS

Referring now more particularly to the accompanying drawings, some preferred embodiments of the apparatus according to the present invention are described below assuming that all of the input video signals are preliminarily sampled and converted to digital signals before being inputted to the apparatus.

Figure 1:
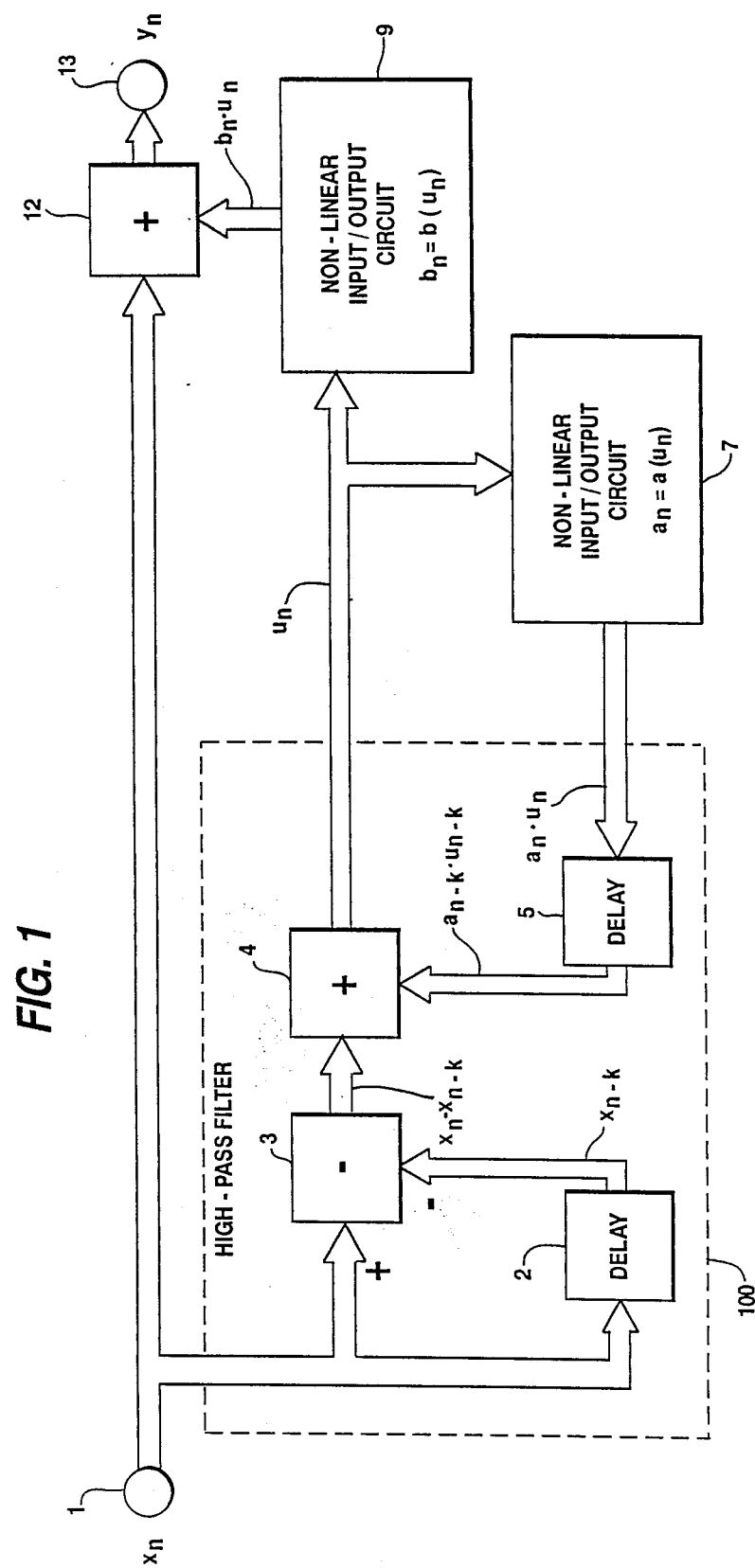
FIG. 1 is a simplified block diagram showing a digital non-linear pre-emphasis apparatus according to a first preferred embodiment of the present invention.

FIG. 1 is a simplified block diagram of the first preferred embodiment of the present invention, which is a digital nonlinear pre-emphasis/apparatus. The apparatus first receives a preliminarily sampled and digitized video signal at an input terminal 1. Then, a delay circuit 2 causes the input signal to delay itself by a specific timecorresponding to k sampling periods (where k denotes a positive integer). The delayed signal is a subtracted from the input signal by a subtraction circuit 3. The output signal of the subtraction circuit 3 is applied to one input terminal of an addition circuit 4. Then, the output signal of the addition circuit 4 is delivered via a non-linear input/output circuit 7 to a delay circuit 5 where it is delayed by a specific time corresponding to specific sampling periods, and fed back to the other input terminal of the addition circuit 4. The delay circuit 2, subtraction circuit 3 and addition circuit 4 with a feedback loop constitute a high-pass filter 100. On the other hand, the output signal of the addition circuit 4 is also delivered via a non-linear input/output circuit 9 to an addition circuit 12 where it is added to the input video signal from the input terminal 1 to obtain an output video signal outputted from an output terminal 13.

Each of the non-linear input/output circuits 7 and 9 generates specific output values which are multiplications of its input signal by specific coefficients non-linearly determined by the amplitudes of the input signal. Such non-linear input/output circuit can comprise a memory which uses the input signal data as address data and has stored therein the specific output values corresponding to addresses specified by the address data.

Figure 2:
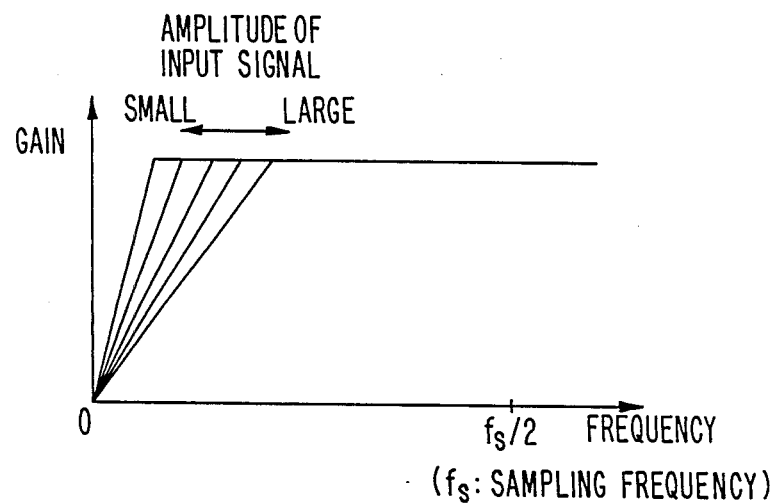
FIG. 2 is a chart showing a frequency characteristic of an output signal of addition circuit 4 shown in FIG. 1 viewing from input terminal 1.

By virtue of the non-linear input/output circuits 7 and 9 mentioned above, the output signal of the addition circuit 4 with respect to the input video signal shows a specific frequency characteristic as passed through a high-pass filter having such a frequency characteristic that the frequency passing band varies in accordance with the input/output ratio of the non-linear input/output circuit 7, i.e., the coefficients non-linearly determined in accordance with the amplitude of the signal inputted to the non-linear input/output circuit 7. For example, when the input-output characteristic of the non-linear input/output circuit 7 is set such that the smaller amplitude of input signals are multiplied by larger positive coefficients, the high-pass filter characteristic becomes such that the frequency passing band becomes wider as the amplitude of the input signal of the non-linear input/output circuit 7 becomes smaller, as schematically shown in FIG. 2.

Figure 3:
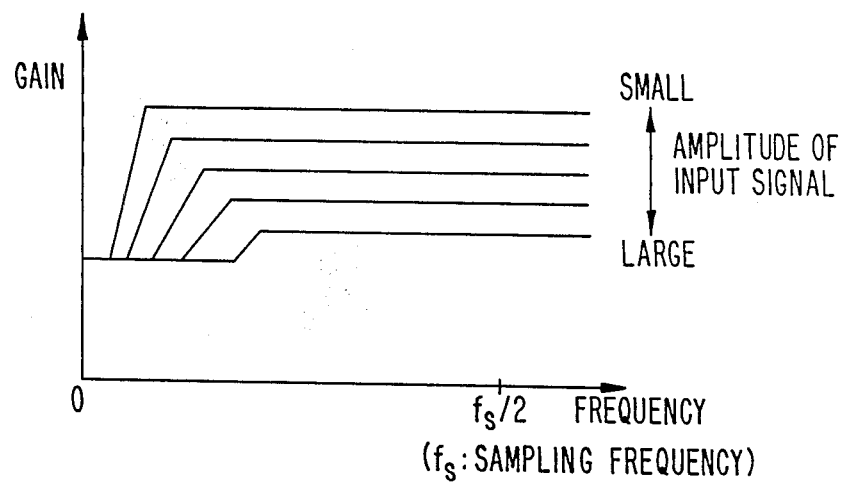
FIG. 3 is a chart showing a frequency characteristic of the first preferred embodiment.

Further, when the non-linear input/output circuit 9 is set to have such an input-output characteristic that the smaller amplitude of input signals are multiplied by larger positive coefficients, high frequency components of the smaller amplitude of signals in the input video signal are emphasized in larger amounts in the output video signal at the output terminal 13, as shown by a schematic frequency characteristic in FIG. 3. Thus, a non-linear pre-emphasis characteristic is effected.

As mentioned above, the first preferred embodiment effects a non-linear pre-emphasis process by digitally processing video signals. Since the apparatus embodied by the present invention totally comprises digital circuits, compared to an analog signal processing system, the apparatus according to the present invention can drastically save the number of components and stabilize video signal processing operations by allowing the apparatus to be integrated on a large-scale IC. The apparatus reflecting the first preferred embodiment independently and optionally sets non-linear input-output characteristics of the non-linear input/output circuit 7 which determines the frequency band to be emphasized and the non-linear input/output circuit 9 which determines the amount of emphasis, respectively.

The following is a description of the operation of the first preferred embodiment of the apparatus according to the present invention using, mathematical expressions. Since the apparatus executes non-linear operations, attention should be paid to the fact that the operation of the apparatus cannot be expressed in the form of a z-conversion which is normally used for linear digital filters.

Assuming that an input signal at the input terminal 1 is $x_n$ at a time n, an output signal at the output terminal 13 is $y_n$, an output signal of the addition circuit 4 is $u_n$, an output signal of the non-linear input/output circuit 7 with respect to the output signal $u_n$ is $a_n \cdot u_n$, an output signal of the non-linear input/output circuit 9 is $b_n \cdot u_n$, i.e., the coefficients realized by the non-linear input/output circuits 7 and 9 are respectively $a_n$ and $b_n$, and the delayed time by each of the delay circuits 2 and 5 is substantially k sampling periods, the following equations can be established:

$$y_n = x_n + b_n u_n \tag{1}$$

$$u_n = x_n - x_{n-k} + a_n u_{n-k} \tag{2}$$

Based on these equations (1) and (2), the following equation can be established:

$$y_n = (1+b_n)x_n - b_n(a_{n-k}/b_{n-k}+1)x_{n-k} + (a_{n-k}b_n/b_{n-k})y_{n-k} \tag{3}$$

Since $a_n$ and $b_n$ are respectively the functions of $u_n$, the following equations (4) and (5) can be established:

$$a_n = a(u_n) \tag{4}$$

$$b_n = b(u_n) \tag{5}$$

Although the first embodiment has been described as the non-linear pre-emphasis apparatus, a non-linear de-emphasis apparatus can be realized in the same configuration by merely changing the functions $a(u_n)$ and $b(u_n)$ of the non-linear input-output circuit as will be described next.

Next, referring to FIG. 4, the second preferred embodiment of the present invention is described below, in which the second preferred embodiment effects a non-linear de-emphasis characteristic which is entirely opposite to the above-noted non-linear pre-emphasis characteristic.

Figure 4:
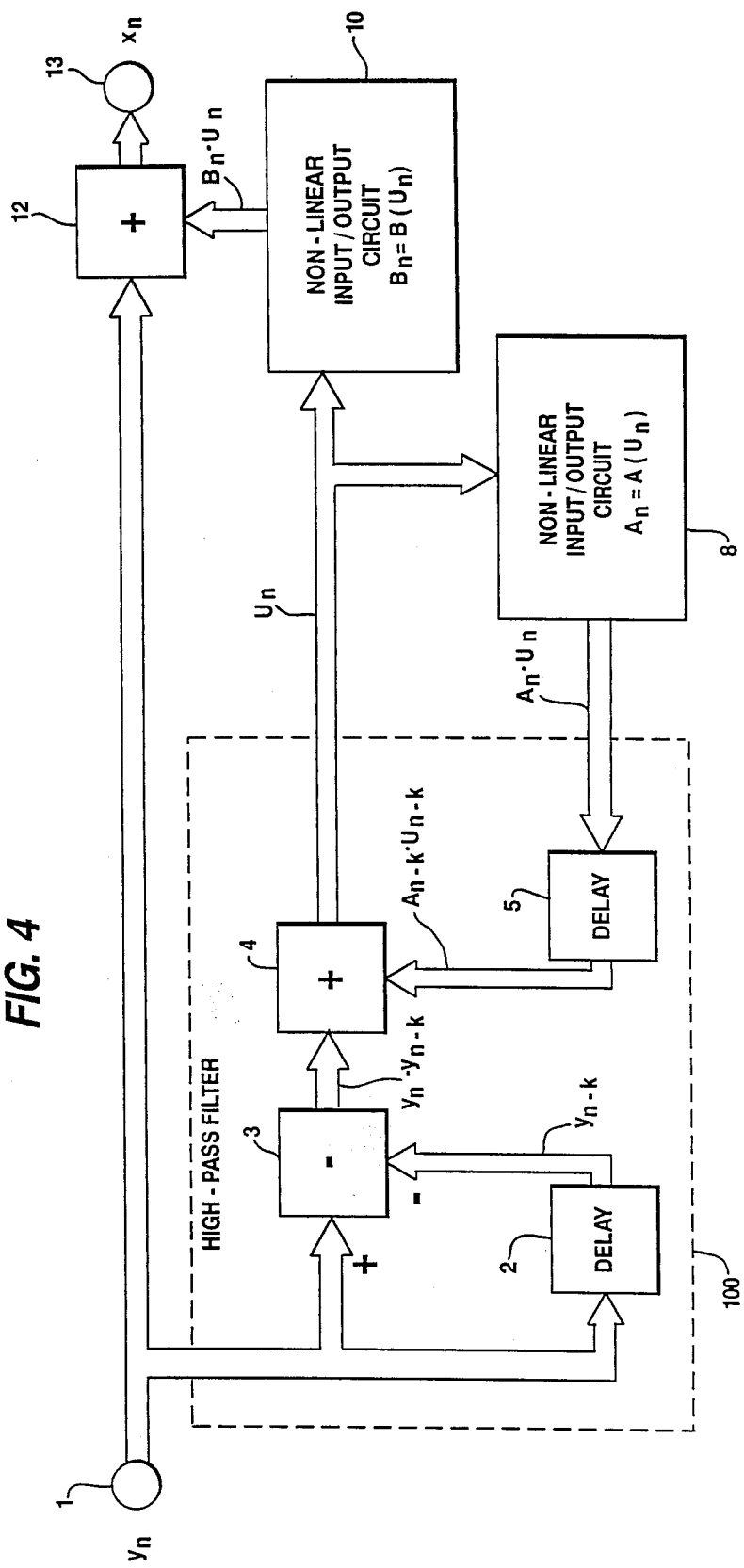
FIG. 4 is a simplified block diagram showing a digital non-linear de-emphasis apparatus according to a second preferred embodiment of the present invention.

FIG. 4 is a simplified block diagram of the second preferred embodiment, which is different from the first preferred embodiment shown in FIG. 1 in the introduction of non-linear input/output circuits 8 and 10 in place of non-linear input/output circuits 7 and 9. The circuits 8 and 10 have different input/output characteristics from those of the circuits 7 and 9.

In the embodiment of FIG. 4, assuming that a signal received at the input terminal 1 is $y_n$ at a time n, an output signal at the output terminal 13 is $x_n$, an output signal of the addition circuit 4 is $U_n$, an output signal of the non-linear input/output circuit 8 with respect to $U_n$ is $A_n \cdot U_n$, an output signal of the non-linear input/output circuit 10 with respect to $U_n$ is $B_n \cdot U_n$, i.e., the coefficients realized by the non-linear input/output circuits 8 and 10 are respectively $A_n$ and $B_n$, the following equations and can be established:

$$x_n = y_n + B_n U_n \tag{6}$$

$$U_n = y_n - y_{n-k} + A_{n-k} U_{n-k} \tag{7}$$

Based on these equations (6) and (7), the following equation can be established:

$$x_n = (1+B_n)y_n - B_n(A_{n-k}/B_{n-k}+1)y_{n-k} + (A_{n-k}B_n/B_{n-k})x_{n-k} \tag{8}$$

Since $A_n$ and $B_n$ are respectively the functions of $U_n$, the following equations can be established.

$$A_n = A(U_n) \tag{9}$$

$$B_n = B(U_n) \tag{10}$$

Here, in order to obtain a non-linear de-emphasis characteristic which is entirely opposite to the previously described non-linear pre-emphasis characteristic, $x_n$ should be the output occurring when $y_n$ shown in equation (3) is inputted. Based on equation (3), the following equation can be established $$X_n = \frac{1}{1+b_n} y_n - \frac{a_{n-k}b_n}{(1+b_n)b_{n-k}} y_{n-k} + \frac{b_n}{1+b_n}\left(\frac{a_{n-k}}{b_{n-k}}+1\right)X_{n-k} \tag{11}$$

Assuming that coefficients of $y_n$, $y_{n-k}$ and $x_{n-k}$ shown in equations (8) and (11) are equal to each other, it is understood that specific conditions expressed by the following equations (12) and (13) are required.

$$A_n = (a_n + b_n) / (1+b_n) \tag{12}$$

$$B_n = -b_n / (1+b_n) \tag{13}$$

As with equations (9) and (10), in order to make $A_n$ and $B_n$ functions of $u_n$ while allowing equations (12) and (13) to be established, it is necessary to have the relationship between $U_n$ shown in equation (7) and $a_n$ and $b_n$ shown in equations (4) and (5). Since $a_n$ and $b_n$ are functions of $u_n$, the relationship between $U_n$ and $A_n$, $B_n$ can be understood by knowing the relationship between $u_n$ shown in equation (2) and $U_n$ shown in equation (7). The relationship between $u_n$ and $U_n$ can be clarified by referring to equations (1), (6) and (13), as shown below.

$$U_n = (1+b_n)u_n \tag{14}$$

In summary, when a non-linear pre-emphasis process is executed by the embodiment shown in FIG. 1 under the condition that the input signal of the non-linear input/output circuits 7 and 9 is expressed by u (n is deleted) and the output signals of the non-linear input/output circuits 7 and 8 are respectively expressed by $a(u) \cdot u$ and $b(u) \cdot u$, the embodiment shown in FIG. 4 can execute a non-linear de-emphasis process opposite to the non-linear pre-emphasis process by setting the input-output characteristics of the non-linear input/output circuits 8 and 10 which receive an input signal U and respectively output signals $A(U) \cdot U$ and $B(U) \cdot U$ so as to satisfy the following equations using u as a parameter:

$$A(U) = \frac{a(u) + b(u)}{1 + b(u)} \tag{15}$$

$$B(U) = -\frac{b(u)}{1 + b(u)} \tag{16}$$

$$U = (1 + b(u)) \cdot u \tag{17}$$

Each of the non-linear input/output circuits 8 and 10 can be easily realized by a memory using the input signal data as address data and storing predetermined output values corresponding to respective addresses specified by the input signal data, thereby fully satisfying the requirements expressed by equations (15) through (17).

As mentioned above, the second preferred embodiment of the apparatus according to the invention executes a non-linear de-emphasis operation for generating specific characteristic which are entirely opposite to that of the non-linear pre-emphasis process. Since the apparatus totally comprises digital circuits realizable on a large-scale IC, as compared to an analog processing system, drastic saving in the number of components and stability of operation can be realized.

Figure 5:
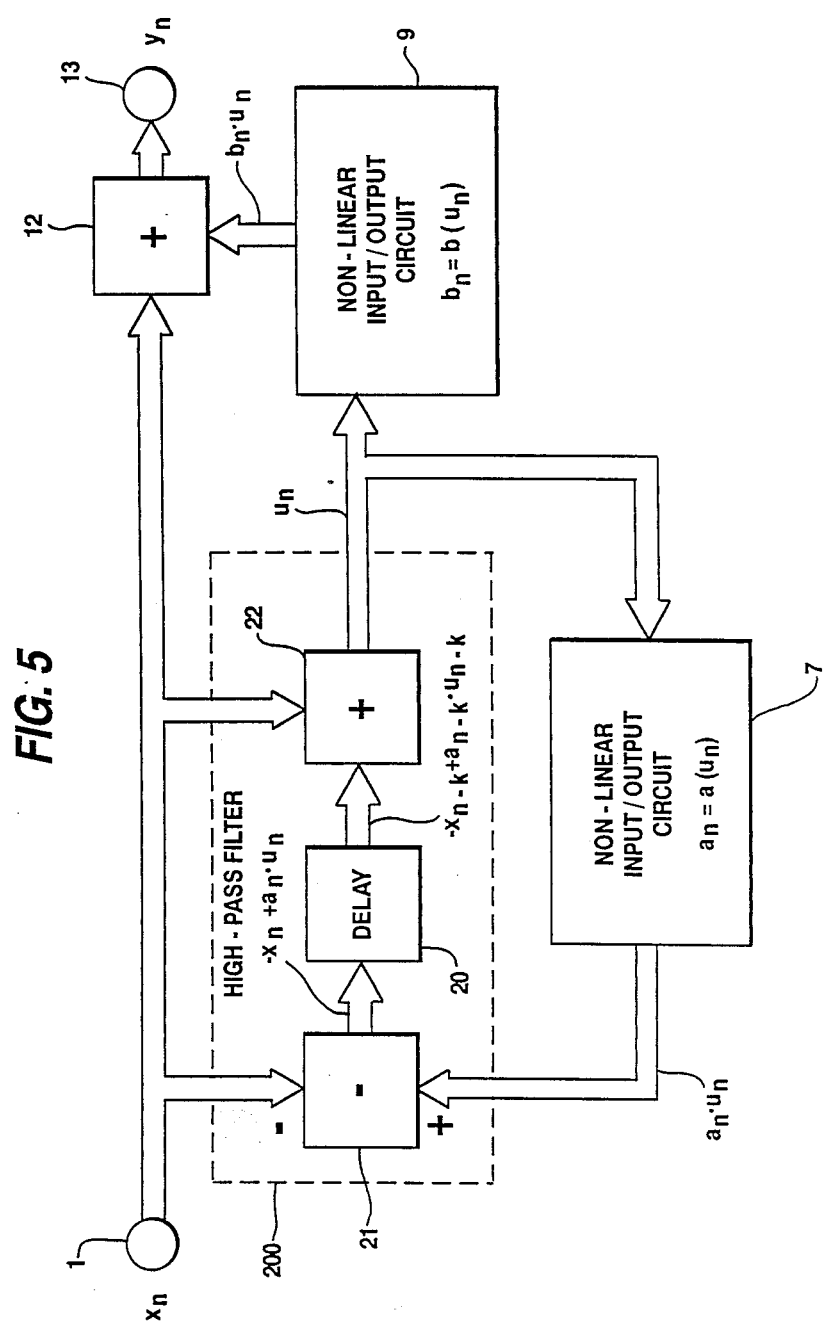
FIG. 5 is a simplified block diagram showing a digital non-linear pre-emphasis apparatus according to a third preferred embodiment of the present invention.

Next, the third preferred embodiment of the present invention is described below. FIG. 5 is a simplified block diagram of the third preferred embodiment which is a nonlinear pre-emphasis apparatus. The circuit elements identical to those which are shown in the first preferred embodiment shown in FIG. 1 are respectively denoted by identical reference numerals. The non-linear pre-emphasis apparatus shown in FIG. 5 first receives a sampled digital video signal from the input terminal 1. A subtraction circuit 21 then subtracts the input video signal from a signal which is fed back from the non-linear input/output circuit 7. The output signal of the subtraction circuit 21 is delayed by a delay circuit 20 by a specific time corresponding to k sampling periods. The delayed signal is added to the input video signal from the input terminal 1 by an addition circuit 22. The output signal of the addition circuit 22 is delivered to the non-linear input output circuit 7. The subtraction circuit 21, delay circuit 20 and addition circuit 22 with a feedback loop constitute a high-pass filter 200 having the same function as that of the previously described high-pass filter 100. On the other hand, the output signal of the addition circuit 22 is also delivered via the non-linear input/output circuit 9 to the addition circuit 12 where it is added to the input video signal from the input terminal 1 to obtain an output video signal outputted from the output terminal 13.

Now, as was done for the preceding preferred embodiments, the functional operation of the non-linear pre-emphasis apparatus of the third preferred embodiment shown in FIG. 5 is expressed by the mathematical expressions contained below. Assuming that, at a time n, an input video signal at the input terminal 1 is $x_n$, an output video signal at the output terminal 13 is $y_n$, an output signal of the addition circuit 22 is $u_n$, and coefficients by the non-linear input/output circuits 7 and 9 with respect to $u_n$ are respectively $a_n$ and $b_n$, the operation of the apparatus can be expressed by the following equations:

$$y_n = x_n + b_n u_n \quad (1)$$

$$u_n = x_n - x_{n-k} + a_{n-k} u_{n-k} \quad (2)$$

Based on these equations (1) and (2), the following equation can be established:

$$y_n = (1+b_n) x_n - b_n (a_{n-k}/b_{n-k}+1) x_{n-k} + (a_{n-k} b_n / b_{n-k}) y_{n-k} \quad (3)$$

This clearly indicates that the apparatus of the third preferred embodiment executes an operation which is exactly identical to that performed by the apparatus of the first preferred embodiment shown in FIG. 1. In other words, the third preferred embodiment executes a non-linear pre-emphasis process by digitally processing video signals. Since the apparatus of the third preferred embodiment totally comprises digital circuits which can be integrated on a large-scale IC, as compared to an analog processing system, a drastic saving of the number of components and stability of operation can be realized.

Furthermore, since the apparatus of the third preferred embodiment delays the mixed signal of the input video signal and the fed-back signal from the non-linear input/output circuit 7, the apparatus can realize the same non-linear pre-emphasis characteristic as that of the first embodiment by using only one delay circuit. This feature is effective particularly when executing emphasis with respect to the vertical direction or movement direction of a video signal, in which the video signal must be delayed by one horizontal scanning period or one frame period using a large scale delay circuit.

A non-linear de-emphasis apparatus can be realized in the configuration of the third embodiment by changing the functions $a(u_n)$ and $b(u_n)$ of the non-linear input/output circuits as will be described below.

Figure 6:
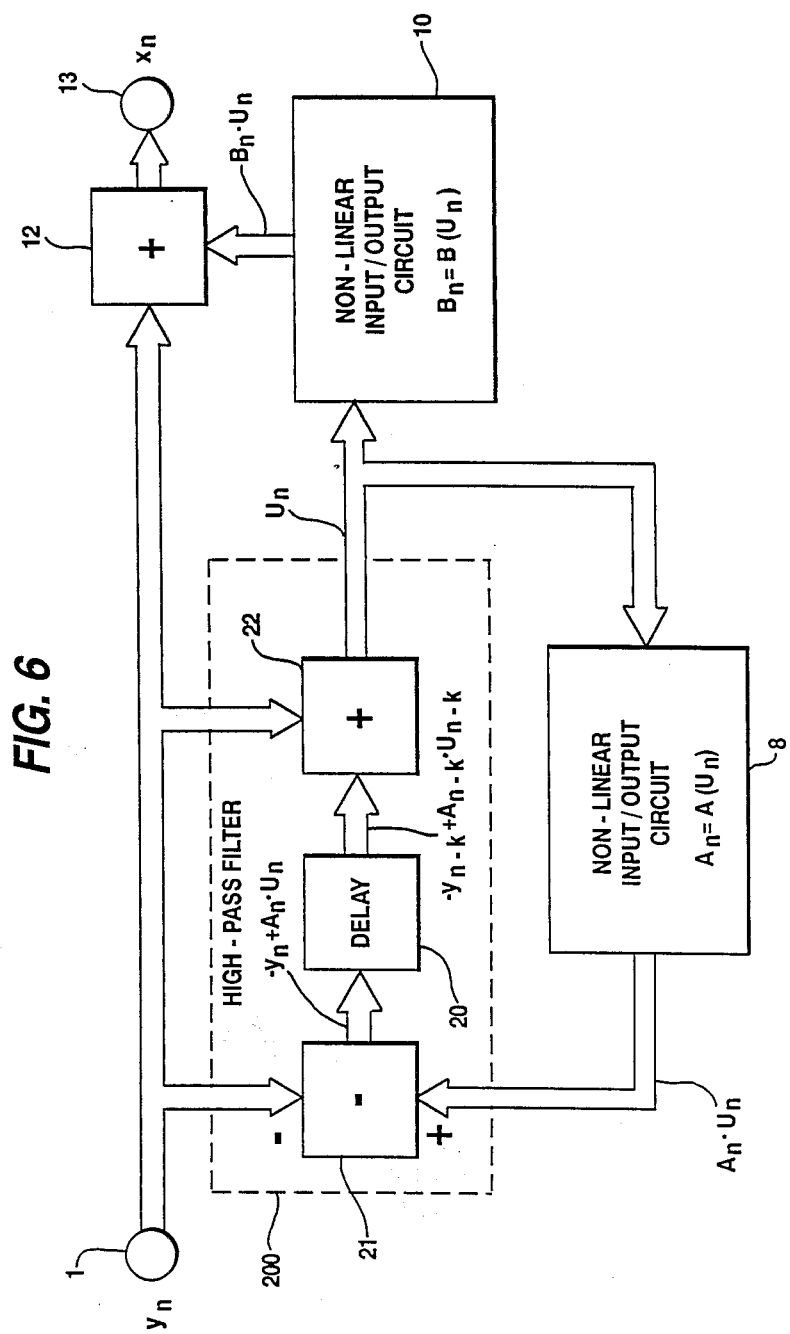
FIG. 6 is a simplified block diagram showing a digital non-linear de-emphasis apparatus according to a fourth preferred embodiment of the present invention.

The fourth preferred embodiment of the present invention is described below. FIG. 6 is a simplified block diagram of the fourth preferred embodiment which is a nonlinear de-emphasis apparatus. This apparatus is provided with non-linear input/output circuits 8 and 10 as used in the second embodiment in FIG. 4 in place of the nonlinear input/output circuits 7 and 9 in the apparatus of the third preferred embodiment shown in FIG. 5.

Assuming that the output signals of the non-linear input/output circuits 7 and 9 shown in FIG. 5 are respectively $a(u) \cdot u$ and $b(u) \cdot u$ with respect to an input signal thereto u, and output signals of the non-linear input/output circuit 8 and 10 shown in FIG. 6 are respectively $A(U) \cdot U$ and $B(U) \cdot U$ with respect to the signal U input thereto, the coefficients of the non-linear input/output circuits 8 and 10, $A(U)$ and $B(U)$, are set to satisfy equations (15) through (17) shown in the preceding description. The fourth preferred embodiment executes the same non-linear de-emphasis process as that of the second preferred embodiment shown in FIG. 4

Next, the fifth and sixth preferred embodiments of the present invention are described below, in which both of these apparatus correctly switch operations between non-linear pre-emphasis and non-linear de-emphasis processes.

Figure 7:
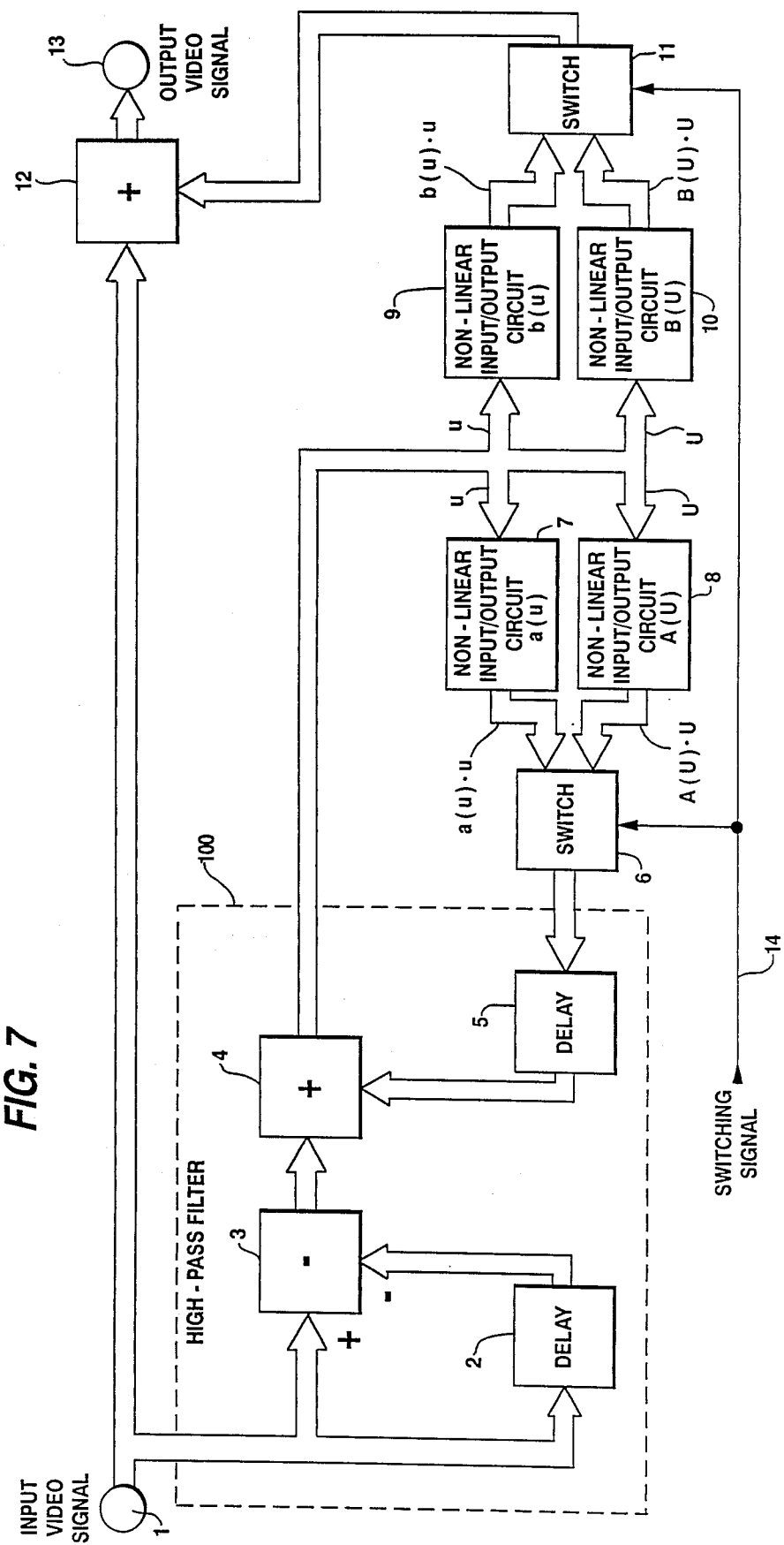
FIG. 7 is a simplified block diagram showing a digital non-linear pre-emphasis/de-emphasis apparatus according to a fifth preferred embodiment of the present invention.
Figure 8:
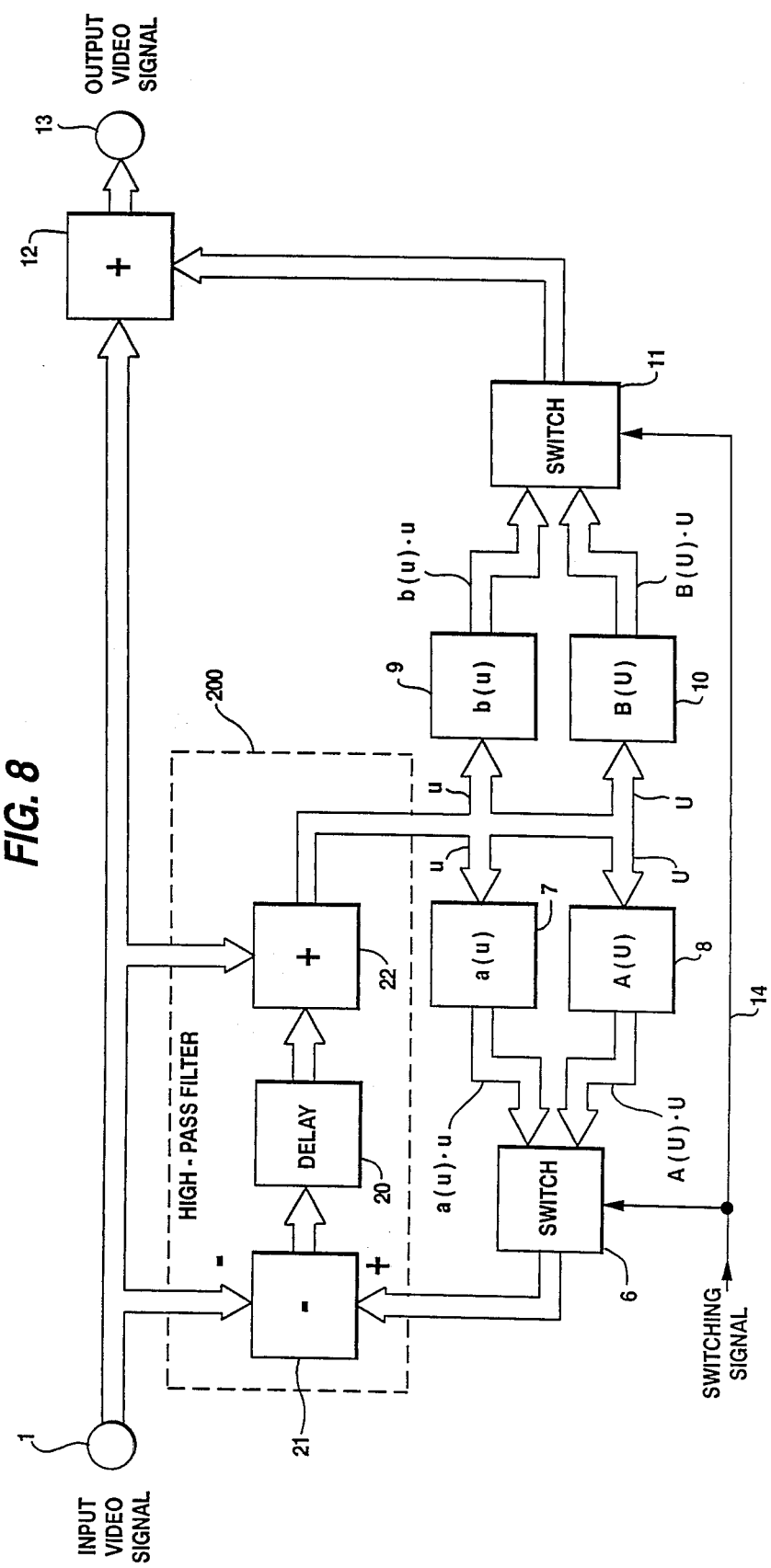
FIG. 8 is a simplified block diagram showing a digital non-linear pre-emphasis/de-emphasis apparatus according to a sixth preferred embodiment of the present invention.

FIGS. 7 and 8 are respectively simplified block diagrams of the fifth and sixth preferred embodiments. Of these, the fifth preferred embodiment shown in FIG. 7 is an improved version of the first preferred embodiment shown in FIG. 1, whereas the sixth preferred embodiment shown in FIG. 8 is an improved version the third preferred embodiment shown in FIG. 5, in which each of these improved apparatus selectively switches between non-linear pre-emphasis and non-linear de-emphasis processes as required. The fifth and sixth preferred embodiments of the apparatus are respectively provided with additional non-linear input/output circuits 8 and 9 and also switches 6 and 11 which are controlled by a switching signal 14.

When the apparatus in FIG. 7 or 8 is used in a video signal recording/reproducing apparatus such as a video tape recorder, a recording/reproduction switching signal is used as the switching signal 14 so that the switches 6 and 11 respectively select the non-linear input/output circuits 7 and 9 in the recording mode and respectively select the non-linear input/output circuits 8 and 10 in the reproduction mode.

The non-linear input/output circuits 7 and 9 are respectively provided with the above-described specific input-output characteristics needed for implementing the non-linear pre-emphasis process, whereas the non-linear input/output circuits 8 and 10 are respectively provided with the above-described specific input-output characteristics needed for implementing the non-linear de-emphasis process. That is, assuming that the input signal to and the output signal from the non-linear input/output circuits 7 and 9 are respectively u, a(u)·u and b(u)·u, and the input signal to and the output signal from the non-linear input/output circuits 8 and 10, are respectively U, A(U)·U and B(U)·U, the coefficients of the non-linear input/output circuits 9 and 10, A(U) and B(U), fully satisfy equations (15) through (17).

Consequently, the fifth and sixth preferred embodiments can execute both the non-linear pre-emphasis process and the non-linear de-emphasis process which is opposite to the non-linear pre-emphasis process in a small-scale circuit configuration.

Although some of the preferred embodiments have been described, it should be understood that the spirit and scope of the present invention are not confined to those which have been described above. The non-linear pre-emphasis and de-emphasis apparatus according to the present invention can be realized in a variety of configurations by fully satisfying those equations shown below.

$$y_n = b_n \cdot U_n + x_n$$

$$U_n = x_n - x_{n-k} + a_{n-k} \cdot U_{n-k}$$

where: $x_n$ denotes an input signal at a time n; $y_n$ an output signal at a time n; $u_n$ a parameter; $a_n$ and $b_n$ functions of $u_n$; and k, a positive integer.

What is claimed is:

1. A digital non-linear pre-emphasis/de-emphasis apparatus fully satisfying the following equations:

$$y_n = b_n \cdot u_n + x_n;\ \text{and}$$

$$u_n = x_n - x_{n-k} + a_{n-k} \cdot u_{n-k},$$

where $x_n$ denotes an input signal at a time n; $y_n$, a output signal; $u_n$ a parameter, $a_n$ and $b_n$ functions of $u_n$; and k, a positive integer.

2. A digital non-linear pre-emphasis/de-emphasis apparatus comprising:
   a high-pass filter means for obtaining a high frequency component signal $u_n$ of an input signal $x_n$ from the input signal $x_n$;
   a first non-linear processing means for multiplying the signal $u_n$ by a coefficient $a_n$ which is a function of $u_n$ to obtain a feedback signal $a_n \cdot u_n$, the feedback signal being fed back to said high-pass filter means to vary a frequency band of said high-pass filter means;
   a second non-linear processing means for multiplying the signal $u_n$ by a coefficient $b_n$ which is a function of $u_n$ to obtain a signal $b_n \cdot u_n$; and
   an operation means for mixing the input signal $x_n$ and the signal $b_n \cdot u_n$ by a predetermined operation to obtain an output signal $y_n$, wherein said apparatus satisfies, at a sampling timing n, the following condition;

$$y_n = b_n \cdot u_n = x_n;\ \text{and}$$

$$u_n = x_n - x_{n-k} + a_{n-k} \cdot u_{n-k}$$

wherein k is a positive integer.

3. An apparatus as in claim 2, wherein said high-pass filter means comprises:
   a first delay means for delaying the input signal $x_n$ by k sampling periods to obtain a delayed input signal $x_n - k$;
   a subtraction means for subtracting the delayed input signal $x_{n-k}$ from the input signal $x_n$ to obtain a signal $x_n - x_{n-k}$;
   a second delay means for delaying the feedback signal $a_n \cdot u_n$ by k sampling periods to obtain a delayed feedback signal $a_{n-k} \cdot u_{n-k}$; and
   an addition means for adding the signal $x_n - x_{n-k}$ from the subtraction means and the delayed feedback signal $a_{n-k} \cdot u_{n-k}$ to obtain the high frequency component signal $u_n = x_n - x_{n-k} + a_{n-k} \cdot u_{n-k}$.

4. An apparatus as in claim 2, wherein said high-pass filter means comprises:
   a subtraction means for subtracting the input signal $x_n$ from the feedback signal $a_n \cdot u_n$ to obtain a signal $a_n \cdot u_n - x_n$;
   a delay means for delaying the signal $a_n \cdot u_n - x_n$ by k sampling periods t obtain a delayed signal $a_{n-k} \cdot u_{n-k} - x_{n-k}$; and
   an addition means for adding the delayed signal $a_{n-k} \cdot u_{n-k} - x_{n-k}$ to the input signal $x_n$ to obtain the high frequency component signal $u_n = x_n - x_{n-k} + a_{n-k} \cdot u_{n-k}$.

5. A digital non-linear pre-emphasis/de-emphasis apparatus comprising:
   a high-pass filter means for obtaining a high frequency component signal of an input signal from the input signal
   first and second non-linear processing means each for multiplying the high frequency component signal by a coefficient which is a function of the high frequency component signal;
   a first switching means for selecting one of outputs of said first and second non-linear processing means to obtain a feedback signal which is fed back to said high-pass filter means to vary a frequency band of said high-pass filter means;
   third and fourth non-linear processing means each for multiplying the high frequency component signal by a coefficient which is a function of the high frequency component signal;
   a second switching means for selecting one of outputs of said third and fourth non-linear processing means; and
   an operation means for mixing the input signal and an output signal of said second switching means to obtain an output signal,
   wherein said apparatus executes a non-linear pre-emphasis process when said first and second switching means respectively select said first and third non-linear processing means, and a non-linear de-emphasis process when said first and second switching means respectively select said second and fourth non-linear processing means.

6. An Apparatus as in claim 5, wherein, supposing that output signals of said first and third non-linear processing means are respectively a(u)·u and b(u)·u with respect to a signal u input thereto, where each of a(u) and b(u) is a function of u, and that output signals of said second and fourth non-linear processing means are respectively A(U)·U and B(U)·U with respect to a signal U input thereto, where each of A(U) and B(U) is a function of U, the following conditions are satisfied.

$$U(A) = \frac{a(u) + b(u)}{1 + b(u)};$$

$$U(B) = \frac{b(u)}{1 + b(u)}; \text{ and}$$

$$U = (1 + b(u)) \cdot u,$$

whereby said non-linear de-emphasis process has a characteristic opposite to that of said non-linear pre-emphasis process.

7. An apparatus as in claim 5, wherein said high-pass filter means comprises:
   a first delay means for delaying the input signal by a predetermined time to obtain a delayed input signal;
   a subtraction means for subtracting the delayed input signal from the input signal;
   a second delay means for delaying the feedback signal by the predetermined time to obtain a delayed feedback signal; and
   an addition means for adding an output signal of said subtraction means and the delayed feedback signal to obtain the high frequency component signal.

8. An apparatus as in claim 5, wherein said high-pass filter means comprises:
   a subtraction means for subtracting the feedback signal from the input signal;
   a delay means for delaying an output signal of said subtraction means by a predetermined time; and
   an addition means for adding an output signal of said delay means and the input signal to obtain the high frequency component signal.

9. A digital non-linear pre-emphasis/de-emphasis apparatus comprising:
   a high-pass filter means for obtaining a high frequency component signal of an input signal;
   a first non-linear processing means for multiplying the high frequency component signal by a coefficient which is a function of the high frequency component signal to obtain a feedback signal which is fed back to said highpass filter means to vary a frequency band of said high-pass filter means;
   a second non-linear processing means for multiplying the high frequency component signal by a coefficient which is a function of the high frequency component signal; and
   an operation means for mixing an output signal of said second non-linear processing means and the input signal to obtain an output signal of said apparatus.

10. An apparatus as in claim 9, wherein said high-pass filter means comprises:
    a first delay means for delaying the input signal by a predetermined time to obtain a delayed input signal;
    a subtraction means for subtracting the delayed input signal from the input signal;
    a second delay means for delaying the feedback signal by the predetermined time to obtain a delayed feedback signal; and
    an addition means for adding an output signal of said subtraction means and the delayed feedback signal to obtain the high frequency component signal.

11. An apparatus as in claim 9, wherein said high-pass filter means comprise:
    a subtraction means for subtracting the feedback signal from the input signal;
    a delay means for delaying an output signal of said subtraction means by a predetermined time; and
    an addition means for adding an output signal of said delay means and the input signal to obtain the high frequency component signal.

* * * * *